(12) United States Patent
Yamaguchi et al.

(10) Patent No.: US 10,431,479 B2
(45) Date of Patent: Oct. 1, 2019

(54) HEAT TREATMENT APPARATUS AND TEMPERATURE CONTROL METHOD

(71) Applicant: Tokyo Electron Limited, Tokyo (JP)

(72) Inventors: Tatsuya Yamaguchi, Iwate (JP); Kazuteru Obara, Iwate (JP); Yasuaki Kikuchi, Iwate (JP); Koji Yoshii, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 76 days.

(21) Appl. No.: 15/864,299

(22) Filed: Jan. 8, 2018

(65) Prior Publication Data

US 2018/0197759 A1 Jul. 12, 2018

(30) Foreign Application Priority Data

Jan. 12, 2017 (JP) ................................. 2017-003548

(51) Int. Cl.
*H01L 21/67* (2006.01)

(52) U.S. Cl.
CPC .. *H01L 21/67109* (2013.01); *H01L 21/67248* (2013.01)

(58) Field of Classification Search
CPC .................... H01L 21/67109; H01L 21/67248
See application file for complete search history.

(56) References Cited

U.S. PATENT DOCUMENTS

| | | | | |
|---|---|---|---|---|
| 5,878,191 A * | 3/1999 | Miyashita | ......... | H01L 21/67115 118/50.1 |
| 7,432,475 B2 * | 10/2008 | Nakajima | ................ | F27B 5/04 118/50.1 |
| 9,099,507 B2 * | 8/2015 | Kobayashi | ............ | C23C 16/463 |
| 9,184,069 B2 * | 11/2015 | Hayashida | ........ | H01L 21/67109 |
| 2009/0095422 A1 * | 4/2009 | Sugishita | ............ | C23C 16/4411 156/345.27 |
| 2011/0223693 A1 * | 9/2011 | Sugishita | ............ | F27B 17/0025 438/5 |
| 2012/0064469 A1 * | 3/2012 | Yoshii | ................ | F27B 17/0025 432/24 |
| 2012/0064472 A1 * | 3/2012 | Yoshii | ................ | F27B 17/0025 432/42 |

FOREIGN PATENT DOCUMENTS

JP      5893280 B2    3/2016

* cited by examiner

*Primary Examiner* — Nathaniel Herzfeld

(74) *Attorney, Agent, or Firm* — Abelman, Frayne & Schwab (57) ABSTRACT

Disclosed is a heat treatment apparatus including: a processing container configured to accommodate a substrate; a furnace body having a heater configured to heat the substrate accommodated in the processing container and provided around the processing container; a blower configured to supply a coolant to a space between the processing container and the furnace body; and a controller having a continuous operation mode in which the blower is continuously energized and an intermittent operation mode in which energization and de-energization of the blower are repeated, and configured to control driving of the blower based on an instruction voltage. The controller drives the blower in the intermittent operation mode when the instruction voltage is higher than 0 V and lower than a predetermined threshold voltage.

8 Claims, 5 Drawing Sheets

HEAT TREATMENT APPARATUS AND TEMPERATURE CONTROL METHOD

CROSS-REFERENCE TO RELATED APPLICATIONS

This application is based on and claims priority from Japanese Patent Application No. 2017-003548 filed on Jan. 12, 2017 with the Japan Patent Office, the disclosure of which is incorporated herein in its entirety by reference.

TECHNICAL FIELD

The present disclosure relates to a heat treatment apparatus and a temperature control method.

BACKGROUND

In the related art, there has been known a vertical heat treatment apparatus capable of performing a batch heat treatment on a plurality of substrates such as, for example, semiconductor wafers.

As a vertical heat treatment apparatus, there has been known an apparatus including a processing container that accommodates a substrate holder for holding a plurality of substrates at a predetermined interval in the height direction, and a furnace body provided around the processing container and including a heater for heating substrates carried into the processing container. As the heater, a so-called energy saving heater having a high heat insulating performance may be used in some cases from the viewpoint of energy saving.

However, in the case of using the energy saving heater, the temperature controllability deteriorates because the furnace temperature is difficult to lower due to the high heat insulating performance. Therefore, a blower is used to forcibly cool the processing container by supplying a coolant (e.g., air) into the furnace body (see, e.g., Japanese Patent No. 5893280). By using a blower, the time for lowering the furnace temperature may be shortened. Thus, the temperature controllability is improved.

SUMMARY

According to an aspect of the present disclosure, there is provided a heat treatment apparatus including: a processing container that accommodates a substrate; a furnace body having a heater for heating the substrate accommodated in the processing container and provided around the processing container; a blower that supplies a coolant to a space between the processing container and the furnace body; and a controller that has a continuous operation mode in which the blower is continuously energized, and an intermittent operation mode in which energization and de-energization of the blower are repeated, and controls driving of the blower based on an instruction voltage. The controller drives the blower in the intermittent operation mode when the instruction voltage is higher than 0 V and lower than a predetermined threshold voltage.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the method of controlling the furnace temperature using a heater and a blower, the temperature may temporarily fluctuate when the blower is stopped. This is because the air volume changes greatly before and after stopping of the blower. In particular, in a case of using a blower having a large size, when the blower is driven at a low rotation speed, the blower may be stopped due to high load. Thus, it is difficult to implement a state of a low air volume. Therefore, the change in the air volume before and after stopping of the blower becomes larger, so that the temperature fluctuation becomes larger when the blower is stopped.

When the temperature fluctuation occurs in this way, the time required for converging the temperature within the furnace to a predetermined temperature (e.g., a target temperature of heat treatment) is prolonged.

Therefore, in consideration of the above problems, an object of the present disclosure is to provide a heat treatment apparatus capable of converging the temperature within a furnace to a predetermined temperature in a short time.

According to an aspect of the present disclosure, there is provided a heat treatment apparatus including: a processing container configured to accommodate a substrate therein; a furnace body having a heater configured to heat the substrate accommodated in the processing container and provided around the processing container; a blower configured to supply a coolant to a space between the processing container and the furnace body; and a controller having a continuous operation mode in which the blower is continuously energized and an intermittent operation mode in which energization and de-energization of the blower are repeated, and configured to control driving of the blower based on an instruction voltage. The controller drives the blower in the intermittent operation mode when the instruction voltage is higher than 0 V and lower than a predetermined threshold voltage.

In the above-described heat treatment apparatus, when the instruction voltage becomes lower than the threshold voltage while the blower is driven in the continuous operation mode, the controller switches the continuous operation mode to the intermittent operation mode.

In the above-described heat treatment apparatus, the threshold voltage is determined based on a lowest instruction voltage of the blower.

In the above-described heat treatment apparatus, the threshold voltage is the lowest instruction voltage of the blower.

The above-described heat treatment apparatus further includes a temperature sensor that detects a temperature in the furnace body. The controller calculates the instruction voltage based on the temperature detected by the temperature sensor.

In the above-described heat treatment apparatus, an energization time in the intermittent operation mode is shorter than a de-energization time.

The above-described heat treatment apparatus further includes a plurality of blowout holes configured to supply the coolant from a plurality of positions in a height direction of the processing container to the space.

According to another aspect of the present disclosure, there is provided a method for controlling a temperature in a furnace body using a heat treatment apparatus including a processing container configured to accommodate a substrate therein, a furnace body having a heater for heating the substrate accommodated in the processing container and provided around the processing container, and a blower configured to supply a coolant to a space between the processing container and the furnace body. The method includes driving the blower in an intermediate operation mode in which energization and de-energization of the blower are repeated when an instruction voltage to the blower is higher than 0 V and lower than a threshold voltage.

According to the heat treatment apparatus of the present disclosure, it is possible to converge to a predetermined temperature in a short time.

Hereinafter, an exemplary embodiment of the present disclosure will be described with reference to the drawings. In the present specification and drawings, components having substantially the same configurations will be denoted by the same symbols, and the overlapping descriptions thereof will be omitted.

(Heat Treatment Apparatus)

Figure 1:
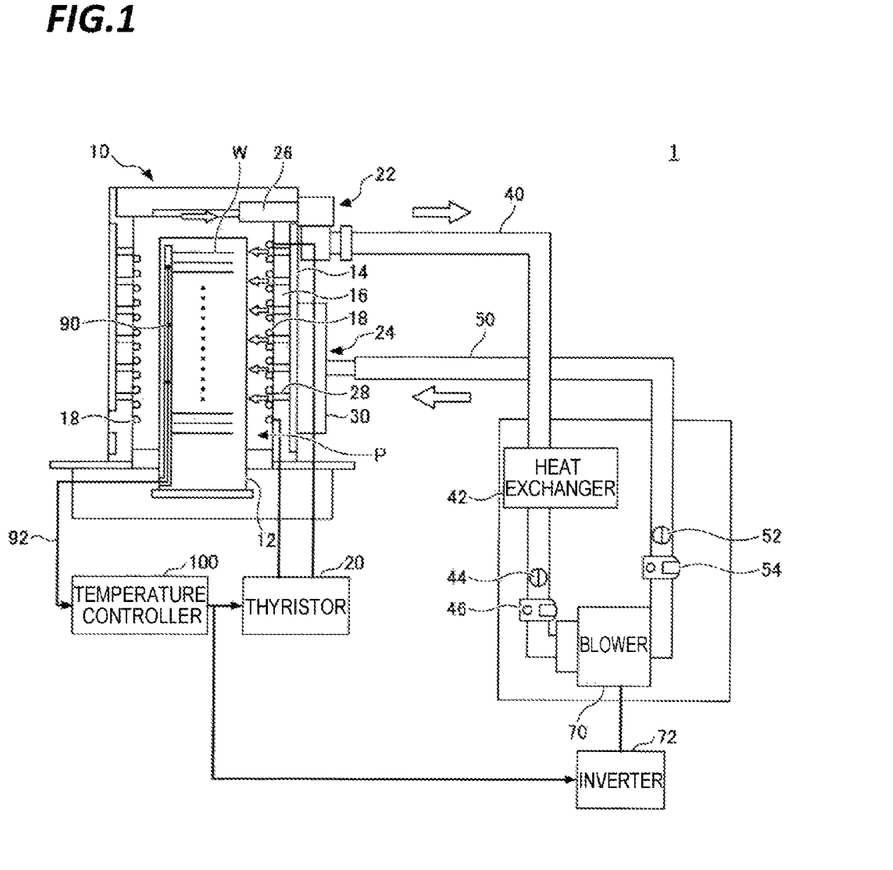
FIG. 1 is a schematic view illustrating a heat treatment apparatus according to an exemplary embodiment of the present disclosure.

First, descriptions will be made on an example of a heat treatment apparatus of the exemplary embodiment of the present disclosure. FIG. 1 is a schematic view illustrating a heat treatment apparatus according to an exemplary embodiment of the present disclosure.

As illustrated in FIG. 1, a heat treatment apparatus 1 includes a vertical heat treatment furnace 10 capable of accommodating a plurality of substrates, for example, semiconductor wafers (hereinafter, simply referred to as "wafers W") at once, and performing a heat treatment such as, for example, oxidation, diffusion, or reduced pressure CVD. The heat treatment furnace 10 includes a processing container 12 and a furnace body 14.

The processing container 12 is disposed within the furnace body 14 such that a space P is defined between the furnace body 14 and the processing container 12. The processing container 12 is a container for accommodating and heat-treating the wafers W. The processing container 12 is made of, for example, quartz.

The furnace body 14 includes a heat insulator 16 and a heater 18. The heat insulator 16 is provided around the processing container 12 and formed in a cylindrical shape. From the viewpoint of energy saving, the heat insulator 16 may be formed of a material having a high heat insulating performance, for example, an inorganic fiber including silica, alumina, or alumina silicate. The heater 18 is formed of a heating resistor arranged in a spiral shape along the inner peripheral surface of the heat insulator 16. The heater 18 heats the wafers W in the processing container 12. The heater 18 is connected with, for example, a thyristor 20.

The furnace body 14 is provided with a heat exhaust system 22 and a forcible cooling unit 24.

The heat exhaust system 22 discharges the atmosphere in the space P between the processing container 12 and the furnace body 14 to the outside. The heat exhaust system 22 has, for example, an exhaust port 26 provided in an upper portion of the furnace body 14. The exhaust port 26 is connected with a coolant exhaust line 40 that exhausts a coolant (e.g., air) in the space P.

The forcible cooling unit 24 forcibly cools the wafers W by supplying a coolant (e.g., air) into the space P from a plurality of positions in the height direction of the processing container 12. The forcible cooling means 24 has a plurality of coolant blowout holes 28 provided along the height direction of the processing container 12. The coolant blowout holes 28 blow out the coolant obliquely toward the center of the heat insulator 16 to generate a swirling flow in the circumferential direction of the space P. The coolant blowout holes 28 are each provided between the vertically adjacent portions of the heater 18 in the heat insulator 16 so as to penetrate the heat insulator 16 radially inward and outward. As a result, the coolant may be ejected into the space P without being disturbed by the heater 18. The coolant blowout holes 28 are connected to a coolant supply line 50 via a coolant supply duct 30.

The coolant exhaust line 40 and the coolant supply line 50 are connected to each other, and a blower 70 is provided at the connecting portion to supply and exhaust the coolant. The blower 70 includes an inverter driving unit 72 and is driven at a rotation speed in accordance with a second instruction voltage from a temperature controller 100 (to be described later). As the rotation speed of the blower 70 changes, the air volume of the coolant ejected into the space P via the coolant supply line 50 changes. Specifically, when the second instruction voltage is decreased, the rotation speed of the blower 70 is decreased, so that the air volume of the coolant ejected into the space P through the coolant supply line 50 is decreased. Meanwhile, when the second instruction voltage is increased, the rotation speed of the blower 70 is increased, so that the air volume of the coolant ejected into the space P through the coolant supply line 50 is increased.

The coolant exhaust line 40 is provided with a heat exchanger 42, a first butterfly valve 44, and a first hole valve 46. The heat exchanger 42 cools the coolant of an increased temperature, which is exhausted from the space P. Both of the first butterfly valve 44 and the first hole valve 46 are configured to be freely opened and closed.

The coolant exhaust line 50 is provided with a second butterfly valve 52 and a second hole valve 54. Both of the second butterfly valve 52 and the second hole valve 54 are configured to be capable of adjusting opening and closing.

With the heat exhaust system 22, the coolant exhaust line 40, the heat exchanger 42, the blower 70, the coolant supply line 50, and the forcible cooling unit 24 constituted as described above, it is possible to forcibly cool the wafers W by supplying a coolant to the space P between the processing container 12 and the furnace body 14. Therefore, for example, when the wafers W are cooled to a furnace temperature at which the wafers W are capable of being carried out from the processing container 12 after a predetermined heat treatment is performed on the wafers W, the furnace temperature may be rapidly lowered. In addition, for example, when a heat treatment is performed at a different temperature by lowering the furnace temperature after the predetermined heat treatment is performed on the wafers W, the furnace temperature may be rapidly lowered. As a result, the processing may be accelerated and the throughput may be improved. In the illustrated example, the coolant exhaust line 40 and the coolant supply line 50 are connected to each other to form a closed system coolant supply/exhaust line, but the present disclosure is not limited thereto. For example, the coolant exhaust line 40 and the coolant supply line 50 may independently form open system coolant supply/exhaust lines.

A temperature sensor 90 is provided within the processing container 12. The temperature sensor 90 detects a temperature in the processing container 12. The temperature sensor 90 is, for example, a thermocouple. In the illustrated example, three temperature sensors 90 are provided at a predetermined interval in the height direction of the processing container 12. Therefore, the temperature distribution in the height direction of the processing container 12 may be detected. The detection signal detected by the temperature sensor 90 is sent to a temperature controller 100 (to be described later) via a signal line 92.

Further, in the heat treatment apparatus 1, a temperature controller 100 is provided to adjust the furnace temperature by controlling the heater 18 and the blower 70.

(Temperature Controller)

Next, descriptions will be made on an example of a control (temperature control method) of the blower 70 by the temperature controller 100.

The temperature controller 100 controls the heater 18 and the blower 70 based on the detection signal from the temperature sensor 90.

Specifically, the temperature controller 100 controls the heater 18 by outputting a predetermined signal to the thyristor 20 based on a predetermined temperature (e.g., a target temperature for the heat treatment) and a detection signal from the temperature sensor 90. Further, the temperature controller 100 controls the blower 70 by outputting a second instruction voltage calculated based on a first instruction voltage to the inverter driving unit 72 for every first time period (e.g., one second). The first instruction voltage is calculated based on, for example, a predetermined temperature (e.g., a target temperature for the heat treatment) and a detection signal from the temperature sensor 90.

The temperature controller 100 has a continuous operation mode in which the blower 70 is continuously energized and an intermittent operation mode in which energization and de-energization of the blower 70 are repeated. The temperature controller 100 drives the blower 70 in the intermittent operation mode when the first instruction voltage is higher than 0 V and lower than the predetermined threshold voltage. The predetermined threshold voltage is a voltage determined based on the lowest instruction voltage of the blower 70, and may be, for example, the lowest instruction voltage of the blower 70. Therefore, the coolant may be supplied to the space P with an air volume smaller than the air volume when the blower 70 is operated at the lowest instruction voltage. Further, the predetermined threshold voltage may be a voltage determined by giving a margin to the lowest instruction voltage of the blower 70. The lowest instruction voltage of the blower 70 is a value determined depending on the type of the blower 70, and may be obtained by referring to, for example, a specification of the blower 70.

Figure 2A:
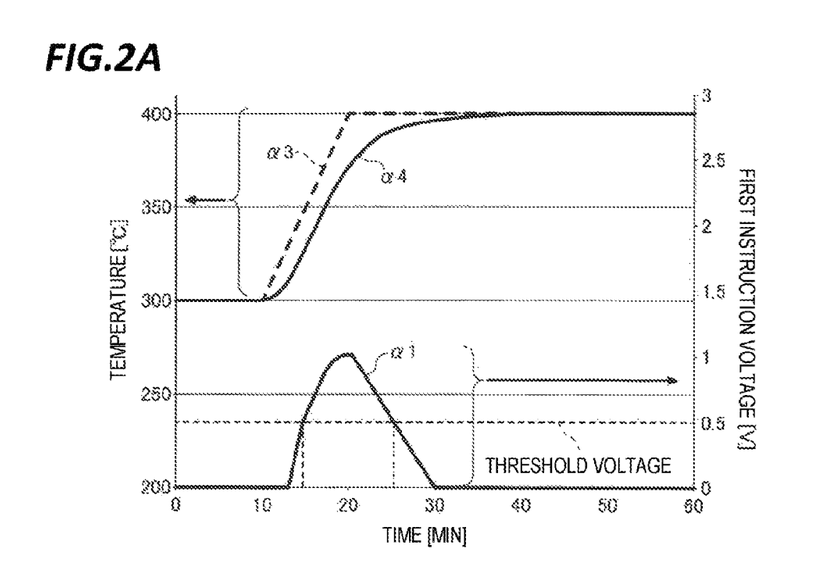
FIGS. 2A and 2B are diagrams for explaining a continuous operation mode and an intermittent operation mode.
Figure 2B:
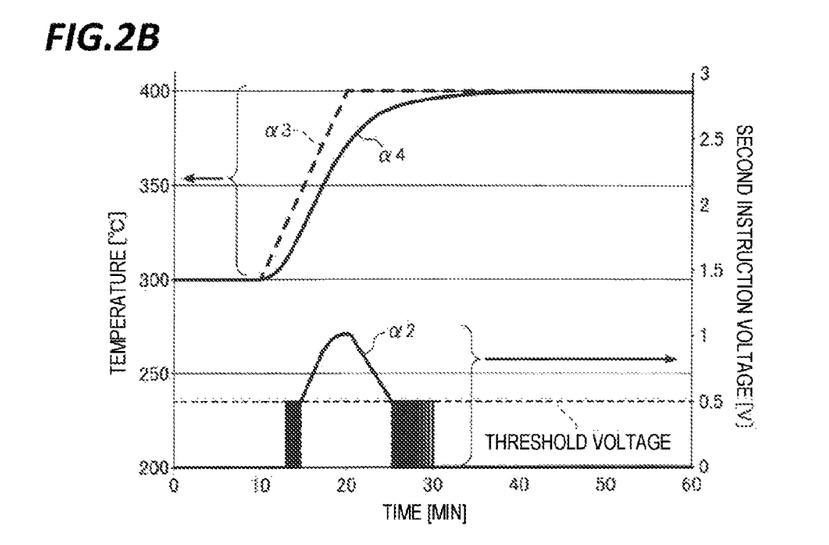

FIGS. 2A and 2B are diagrams for explaining the continuous operation mode and the intermittent operation mode.

FIG. 2A illustrates a relationship between the first instruction voltage and the temperature. In FIG. 2A, the horizontal axis represents a time [min], the vertical axis on the left side represents a temperature [° C.], and the vertical axis on the right side represents a first instruction voltage [V]. In addition, in FIG. 2A, the characteristic line α1 indicates a first instruction voltage [V], the characteristic line α3 indicates a furnace set temperature [° C.], and the characteristic line α4 indicates a furnace temperature [° C.].

FIG. 2B illustrates a relationship between the second instruction voltage and the temperature. In FIG. 2B, the horizontal axis represents a time [min], the vertical axis on the left side represents a temperature [° C.], and the vertical axis on the right side represents a second instruction voltage [V]. In addition, in FIG. 2B, the characteristic line α2 indicates a second instruction voltage [V], the characteristic line α3 indicates a furnace set temperature [° C.], and the characteristic line α4 indicates a furnace temperature [° C.].

FIGS. 2A and 2B illustrates a case where a predetermined threshold voltage is 0.5 V which is equal to the lowest instruction voltage of the blower 70, as an example.

The temperature controller 100 controls the heater 18 and the blower 70, for example, when raising the furnace temperature from 300° C. to 400° C. Specifically, as illustrated in FIG. 2A, when the first instruction voltage becomes higher than 0 V and lower than the predetermined threshold voltage of 0.5 V after the temperature begins to rise (about 13 minutes in the illustrated example), the temperature controller 100 drives the blower 70 in the intermittent operation mode. At this time, the temperature controller 100 calculates the second instruction voltage to be output to the blower 70 based on the first instruction voltage, and outputs the calculated second instruction voltage to the blower 70, thereby driving the blower 70 in the intermittent operation mode. A method of calculating the second instruction voltage will be described later.

Subsequently, when the first instruction voltage becomes equal to or higher than the predetermined threshold voltage of 0.5 V (about 14 minutes in the illustrated example), the temperature controller 100 drives the blower 70 in the continuous operation mode. At this time, the temperature controller 100 outputs the first instruction voltage to the blower 70 as the second instruction voltage, thereby driving the blower 70 in the continuous operation mode.

Subsequently, when the first instruction voltage becomes lower than the predetermined threshold voltage of 0.5 V (about 26 minutes in the illustrated example), the temperature controller 100 drives the blower 70 in the intermittent operation mode. At this time, the temperature controller 100 calculates the second instruction voltage to be output to the blower 70 based on the first instruction voltage, and outputs the second instruction voltage to the blower 70, thereby driving the blower 70 in the intermittent operation mode. A method of calculating the second instruction voltage will be described later.

Subsequently, when the first instruction voltage becomes 0 V (about 30 minutes in the illustrated example), the temperature controller 100 stops the blower 70.

Next, an example of the method of calculating the second instruction voltage in the intermittent operation mode will be described.

In the intermittent operation mode, the temperature controller 100 controls the blower 70 for, as 1 unit, a second time period (e.g., 4 seconds) longer than the first time period (for example, 1 second).

FIGS. 3A to 3E are diagrams each illustrating an example of a waveform pattern of the second instruction voltage.

FIGS. 3A, 3B, 3C, 3D, and 3E illustrate waveforms of the second instruction voltage to be output to the inverter driving unit 72 in the case where the first instruction voltages are 0.500 V, 0.375 V, 0.250 V, 0.125 V, and 0.000 V, respectively. In FIGS. 3A to 3E, the horizontal axis represents a time and the vertical axis represents a voltage [V]. In addition, times t0, t1, t2, t3, and t4 in FIGS. 3A to 3E are, for example, 0 second, 1 second, 2 seconds, 3 seconds, and 4 seconds, respectively.

Figure 3A:
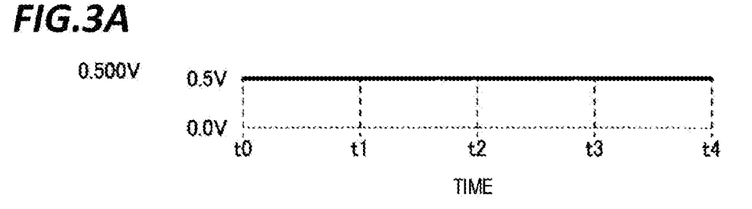
FIGS. 3A to 3E are diagrams each illustrating an example of a waveform pattern of a second instruction voltage.

When the first instruction voltage is 0.500 V, for example, as illustrated in FIG. 3A, the temperature controller 100 outputs 0.5 V to the inverter driving unit 72 at times t0, t1, t2, and t3.

Figure 3B:
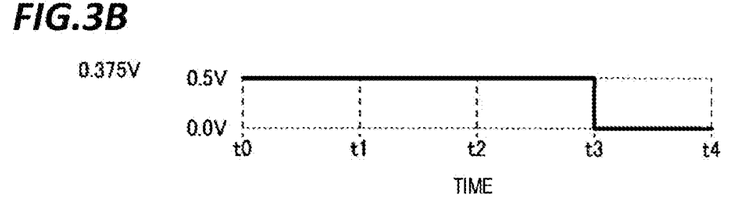

In addition, when the first instruction voltage is 0.375 V, for example, as illustrated in FIG. 3B, the temperature controller 100 outputs 0.5 V to the inverter driving unit 72 at times t0, t1, and t2, and outputs 0 V to the inverter driving unit 72 at time t3. The temperature controller 100 may output 0.5 V to the inverter driver 72 at any three of the four times and output 0 V to the inverter driver 72 at the remaining time. The timing is not limited to the example of FIG. 3B.

Figure 3C:
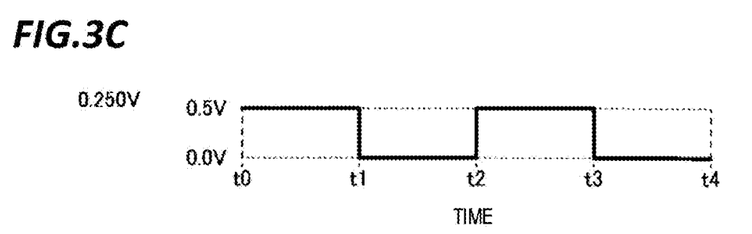

In addition, when the first instruction voltage is 0.250 V, for example, as illustrated in FIG. 3C, the temperature controller 100 outputs 0.5 V to the inverter driving unit 72 at times t0 and t2, and outputs 0 V to the inverter driving unit 72 at times t1 and t3. The temperature controller 100 may output 0.5 V to the inverter driver 72 at any two of the four times and output 0 V to the inverter driver 72 at the remaining two times. The timing is not limited to the example of FIG. 3C.

Figure 3D:
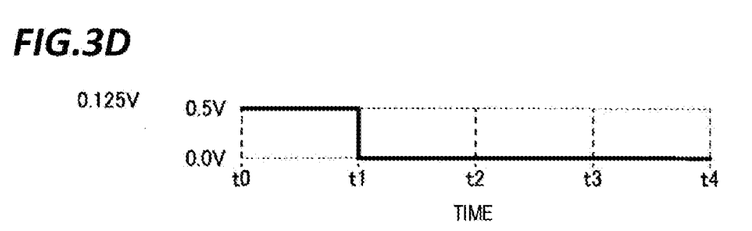

In addition, when the first instruction voltage is 0.125 V, for example, as illustrated in FIG. 3D, the temperature controller 100 outputs 0.5 V to the inverter driving unit 72 at time t0, and outputs 0 V to the inverter driving unit 72 at times t1, t2, and t3. The temperature controller 100 may output 0.5 V to the inverter driver 72 at any one of the four times and output 0 V to the inverter driver 72 at the remaining three times. The timing is not limited to the example of FIG. 3D.

Figure 3E:
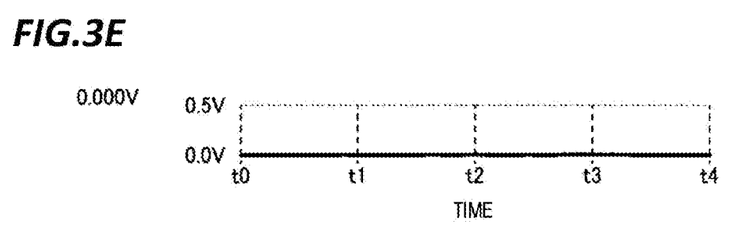

When the first instruction voltage is 0.000 V, for example, as illustrated in FIG. 3E, the temperature controller 100 outputs 0 V to the inverter driving unit 72 at times t0, t1, t2, and t3.

Next, another example of the method of calculating the second instruction voltage in the intermittent operation mode will be described.

The temperature controller 100 outputs the second instruction voltage to the inverter driving section 72 using the following method. Hereinafter, it is assumed that the first time period is T1, the second time period is T2, the predetermined threshold voltage is X, the first instruction voltage at time t0 is X1, and the first instruction voltage at time t4 when the second time period T2 has elapsed from time t1 is X2.

First, a resolution Xr is calculated by dividing the predetermined threshold voltage X by a ratio of the second time period T2 and the first time period T1 (T2/T1).

Subsequently, the first instruction voltage X1 at time t0 is divided by the resolution Xr, and a remainder Y1 is calculated from the division.

Subsequently, the second instruction voltage is output when the voltage waveform output to the inverter driving unit 72 becomes a waveform corresponding to a value obtained by subtracting the remainder Y1 from the first instruction voltage X1 (X1−Y1).

Subsequently, a value obtained by adding the remainder Y1 to the first instruction voltage X2 at time t4 (X2+Y1) is divided by the resolution Xr, and a remainder Y2 is calculated from the division.

Subsequently, the second instruction voltage is output when the voltage waveform output to the inverter driving unit 72 becomes a waveform corresponding to a value obtained by subtracting the remainder Y2 from a value obtained by adding the remainder Y1 to the first instruction voltage X2 (X2+Y1−Y2).

Thereafter, even at the time when the second time period T2 has elapsed n times (n is an integer of 2 or more) from time t0, the second instruction voltage is output to the inverter driver 72 by the same method.

Figure 4A:
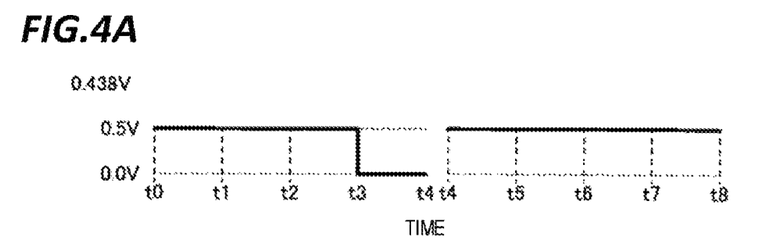
FIGS. 4A and 4B are diagrams each illustrating another example of the waveform pattern of the second instruction voltage.
Figure 4B:
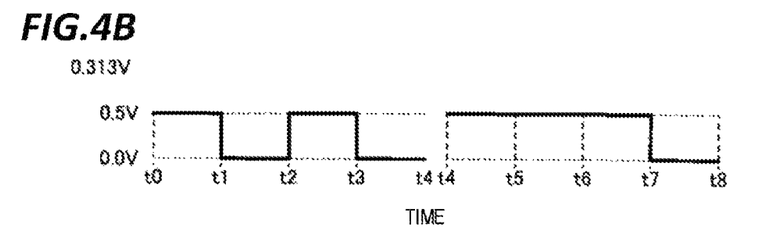

Next, detailed descriptions will be made on an exemplary case where the first time period T1 is 1 second, the second time period T2 is 4 seconds, and the threshold voltage X is 0.500 V. FIGS. 4A and 4B are diagrams each illustrating another example of the waveform pattern of the second instruction voltage. FIGS. 4A and 4B illustrate waveform patterns of the second instruction voltage to be output to the inverter driving unit 72 when the first instruction voltage is 0.438 V and when the first instruction voltage is 0.313 V, respectively. In FIGS. 4A and 4B, the horizontal axis represents a time and the vertical axis represents a voltage [V]. In addition, times t0, t1, t2, t3, t4, t5, t6, t7, and t8 in FIGS. 4A and 4B are, for example, 0 second, 1 second, 2 seconds, 3 seconds, 4 seconds, 5 seconds, 6 seconds, 7 seconds, and 8 seconds, respectively.

First, descriptions will be made on a case where the first instruction voltage X1 at time t0 is 0.438 V and the first instruction voltage X2 at time t4 is 0.438 V.

First, a resolution Xr is calculated by dividing the threshold voltage X (0.500 V) by a ratio between the second time period T2 (4 seconds) and the first time period T1 (1 second) (4 seconds/1 second). At this time, the resolution Xr is calculated to be 0.125 V.

Subsequently, the first instruction voltage X1 (0.438 V) at time t0 is divided by the resolution Xr (0.125 V), and a remainder Y1 is calculated from the division. At this time, the resolution Xr is calculated to be 0.063 V.

Subsequently, as illustrated on the left side of FIG. 4A, the second instruction voltage is output when the voltage waveform output to the inverter driving unit 72 becomes a waveform corresponding to the value (0.375 V) obtained by subtracting the remainder Y1 (0.063V) from the first instruction voltage X1 (0.438 V). Specifically, the temperature controller 100 outputs 0.5 V to the inverter driving unit 72 at times t0, t1, and t2, and outputs 0 V to the inverter driving unit 72 at time t3.

Subsequently, a value (0.501 V) obtained by adding the remainder Y1 (0.063 V) to the first instruction voltage X2 (0.438 V) at time t4 is divided by the resolution Xr (0.125 V), and a remainder Y2 is calculated from the division. At this time, the remainder Y2 is calculated to be 0.001 V.

Subsequently, as illustrated on the right side of FIG. 4A, the second instruction voltage is output when the voltage waveform output to the inverter driving unit 72 becomes a waveform corresponding to the value (0.500 V) obtained by subtracting the remainder Y2 (0.001 V) from the value (0.501 V) obtained by adding the remainder Y1 to the first instruction voltage X2. Specifically, the temperature controller 100 outputs 0.5 V to the inverter driving unit 72 at times t4, t5, t6, and t7.

Next, descriptions will be made on a case where the first instruction voltage X1 at time t0 is 0.313 V and the first instruction voltage X2 at time t4 is 0.313 V.

First, a resolution Xr is calculated by dividing the threshold voltage X (0.500 V) by a ratio between the second time period T2 (4 seconds) and the first time period T1 (1 second) (4 seconds/1 second). At this time, the resolution Xr is calculated to be 0.125 V.

Subsequently, the first instruction voltage X1 (0.313 V) at time t0 is divided by the resolution Xr (0.125 V), and a remainder Y1 is calculated from the division. At this time, the resolution Xr is calculated to be 0.063 V.

Subsequently, as illustrated on the left side of FIG. 4B, the second instruction voltage is output when the voltage waveform output to the inverter driving unit 72 becomes a waveform corresponding to the value (0.250 V) obtained by subtracting the remainder Y1 (0.063V) from the first instruction voltage X1 (0.313 V). Specifically, the temperature controller 100 outputs 0.5 V to the inverter driving unit 72 at times t0 and t2, and outputs 0 V to the inverter driving unit 72 at times t1 and t3.

Subsequently, a value (0.376 V) obtained by adding the remainder Y1 (0.063 V) to the first instruction voltage X2 (0.313 V) at time t4 is divided by the resolution Xr (0.125 V), and a remainder Y2 is calculated from the division. At this time, the remainder Y2 is calculated to be 0.001 V.

Subsequently, as illustrated on the right side of FIG. 4B, the second instruction voltage is output when the voltage waveform output to the inverter driving unit 72 becomes a waveform corresponding to the value (0.375 V) obtained by subtracting the remainder Y2 (0.001 V) from the value (0.376 V) obtained by adding the remainder Y1 to the first instruction voltage X2. The temperature controller 100 outputs 0.5 V to the inverter driving unit 72 at times t4, t5, and t6, and outputs 0 V to the inverter driving unit 72 at time t7.

Figure 5:
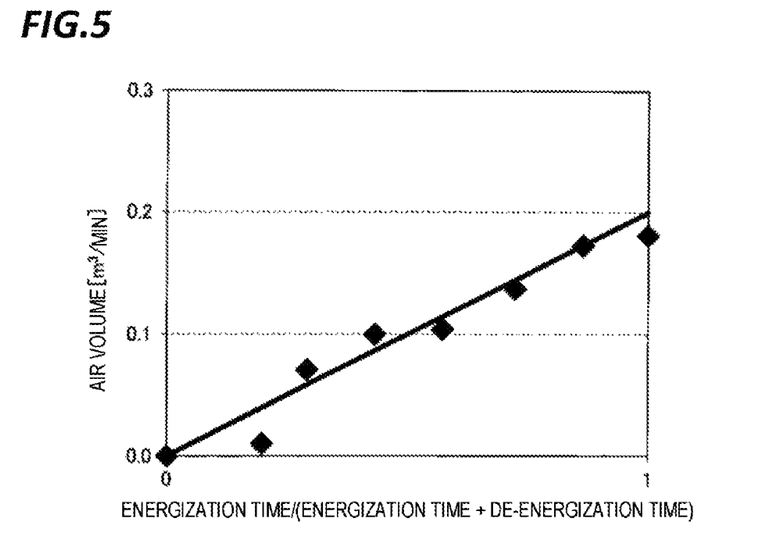
FIG. 5 is a diagram illustrating a relationship between a ratio of energization time/(energization time+de-energization time) and an air volume.

Next, descriptions will be made on a relationship between a ratio of energization time/(energization time+de-energization time) in the intermittent operation mode when the blower 70 is controlled using the above-described temperature control method, and an air volume of the blower 70. FIG. 5 is a diagram illustrating the relationship between a ratio of energization time/(energization time+de-energization time) and an air volume. In FIG. 5, the horizontal axis represents a ratio of energization time to the sum of energization time and de-energization time in the intermittent operation mode, and the vertical axis represents an air volume [m³/min]. In addition, in FIG. 5, the second instruction voltages in the energization time are all 0.7 V.

As illustrated in FIG. 5, when the energization time/(energization time+de-energization time) is 1, that is, in the continuous operation mode, the air volume is about 0.2 m³/min.

In contrast, when the energization time/(energization time+de-energization time) is ¾, for example, when the energization time is 3 seconds and the de-energization time is 1 second, the air volume is about 0.14 m³/min.

Further, when the energization time/(energization time+de-energization time) is ½, for example, when the energization time is 2 seconds and the de-energization time is 2 seconds, the air volume is about 0.1 m³/min.

Further, when the energization time/(energization time+de-energization time) is ¼, for example, when the energization time is 1 second and the de-energization time is 3 seconds, the air volume is about 0.08 m³/min.

As described above, it is confirmed that changing the energization time/(energization time+de-energization time) makes it possible to operate the blower 70 with an air volume lower than the air volume of the blower 70 when operating the blower 70 in the continuous operation mode.

EXAMPLE

In Example, the heater 18 and the blower 70 were controlled by the temperature controller 100 to rise the furnace temperature to a target temperature (800° C.) for a heat treatment, and then a fluctuation in the furnace temperature when the blower 70 was stopped was confirmed.

Figure 6:
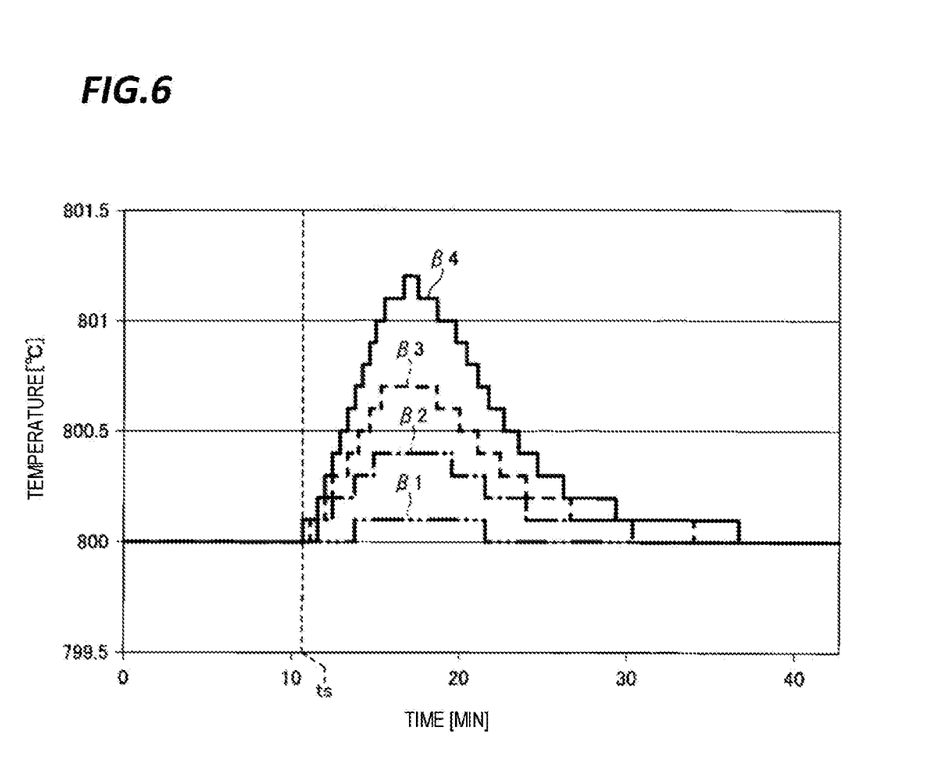
FIG. 6 is a diagram illustrating a temperature fluctuation when the blower is stopped.

FIG. 6 is a diagram illustrating a temperature fluctuation when the blower is stopped. In FIG. 6, the horizontal axis represents a time [min], and the vertical axis represents temperature [° C.]. Further, in FIG. 6, a characteristic line β1 indicates a temperature fluctuation when the blower 70 is stopped after driving the blower 70 in the intermittent operation mode (energization time/de-energization time=1 second/3 seconds) for a predetermined time. A characteristic line β2 indicates a temperature fluctuation when the blower 70 is stopped after driving the blower 70 in the intermittent operation mode (energization time/de-energization time=1 second/1 second) for a predetermined time. A characteristic line β3 indicates a temperature fluctuation when the blower 70 is stopped after driving the blower 70 in the intermittent operation mode (energization time/de-energization time=3 seconds/1 second) for a predetermined time. A characteristic line β4 indicates a temperature fluctuation when the blower 70 is stopped without the intermittent operation. In FIG. 6, the time when the blower 70 is stopped is indicated as "ts."

As illustrated in FIG. 6, the temperature fluctuation when the blower 70 was stopped after being driven for a predetermined time in the intermittent operation mode (energization time/de-energization time=1 second/3 seconds) was 0.1° C. or less (see the characteristic line β1). In addition, the time to converge the temperature fluctuation to the target temperature was about 10 minutes.

Further, the temperature fluctuation when the blower 70 was stopped after being driven for a predetermined time in the intermittent operation mode (energization time/de-energization time=1 second/1 second) was 0.4° C. or less (see the characteristic line β2). In addition, the time to converge the temperature fluctuation to the target temperature was about 20 minutes.

Further, the temperature fluctuation when the blower 70 was stopped after being driven for a predetermined time in the intermittent operation mode (energization time/de-energization time=3 seconds/1 second) was 0.7° C. or less (see the characteristic line β3). In addition, the time to converge the temperature fluctuation to the target temperature was about 23 minutes.

Meanwhile, the temperature fluctuation when the blower 70 was stopped without switching to the intermittent operation mode was 1.0° C. or more (see the characteristic line β4). In addition, the time to converge the temperature fluctuation to the target temperature was about 28 minutes.

From the above results, when the blower 70 is driven in the intermittent operation mode for a predetermined time and then stopped, the temperature fluctuation may be reduced compared with the case of stopping the blower 70 without switching to the intermittent operation mode.

Further, when the blower 70 is driven in the intermittent operation mode for a predetermined time and then stopped, the time to converge the temperature fluctuation to the target temperature may be reduced compared with the case of stopping the blower 70 without switching to the intermittent operation mode.

Further, as the energization time/de-energization time in the intermittent operation mode is decreased, the temperature fluctuation when the blower 70 is stopped may be reduced. In addition, when the energization time is shorter than the de-energization time, the temperature fluctuation is hardly observed when the blower 70 is stopped. From this, it is particularly desirable that the energization time in the intermittent operation mode is shorter than the de-energization time.

In the above-described exemplary embodiment, the temperature controller 100 is an example of the controller.

In the above-described exemplary embodiment, a semiconductor wafer has been exemplified as a substrate, but the present disclosure is not limited thereto. The present disclosure may also be applied to, for example, a glass substrate, an LCD substrate, or a ceramic substrate.

In the above-described exemplary embodiment, descriptions have been made on a batch-type heat treatment apparatus that performs a heat treatment on a plurality of wafers at once, but the present disclosure is not limited thereto. The present disclosure may also be applied to a single wafer type heat treatment apparatus that performs a heat treatment on the wafers one by one.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A heat treatment apparatus comprising:
 a processing container configured to accommodate a substrate therein;
 a furnace body having a heater configured to heat the substrate accommodated in the processing container and provided around the processing container;
 a blower configured to supply a coolant to a space between the processing container and the furnace body; and
 a controller having a continuous operation mode in which the blower is continuously energized and an intermittent operation mode in which energization and de-energization of the blower are repeated, and configured to control driving of the blower based on an instruction voltage,
 wherein the controller drives the blower in the intermittent operation mode when the instruction voltage is higher than 0 V and lower than a predetermined threshold voltage.

2. The heat treatment apparatus of claim 1, wherein, when the instruction voltage becomes lower than the threshold voltage while the blower is driven in the continuous operation mode, the controller switches the continuous operation mode to the intermittent operation mode.

3. The heat treatment apparatus of claim 1, wherein the threshold voltage is determined based on a lowest instruction voltage of the blower.

4. The heat treatment apparatus of claim 3, wherein the threshold voltage is the lowest instruction voltage of the blower.

5. The heat treatment apparatus of claim 1, further comprising:
 a temperature sensor that detects a temperature in the furnace body,
 wherein the controller calculates the instruction voltage based on the temperature detected by the temperature sensor.

6. The heat treatment apparatus of claim 1, wherein an energization time in the intermittent operation mode is shorter than a de-energization time.

7. The heat treatment apparatus of claim 1, further comprising:
 a plurality of blowout holes configured to supply the coolant from a plurality of positions in a height direction of the processing container to the space.

8. A method for controlling a temperature in a furnace body using a heat treatment apparatus including a processing container configured to accommodate a substrate, a furnace body having a heater for heating the substrate accommodated in the processing container and provided around the processing container, and a blower configured to supply a coolant to a space between the processing container and the furnace body, the method comprising:
 driving the blower in an intermediate operation mode in which energization and de-energization of the blower are repeated when an instruction voltage to the blower is higher than 0 V and lower than a threshold voltage.

* * * * *